United States Patent
Selvanayagam et al.

(10) Patent No.: US 12,301,176 B2
(45) Date of Patent: May 13, 2025

(54) LOW LOSS TRAVELLING WAVE PARAMETRIC DEVICES USING PLANAR CAPACITORS

(71) Applicant: INTERNATIONAL BUSINESS MACHINES CORPORATION, Armonk, NY (US)

(72) Inventors: Michael Karunendra Selvanayagam, Ossining, NY (US); Corrado P. Mancini, Hopewell Junction, NY (US); David Lokken-Toyli, White Plains, NY (US); Gerald W. Gibson, Danbury, CT (US); Kathryn Turner Schonenberg, Wappingers Falls, NY (US); Shayne Cairns, Valhalla, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 435 days.

(21) Appl. No.: 17/932,659

(22) Filed: Sep. 15, 2022

(65) Prior Publication Data

US 2024/0097634 A1 Mar. 21, 2024

(51) Int. Cl.
 *H03F 19/00* (2006.01)
(52) U.S. Cl.
 CPC ................... *H03F 19/00* (2013.01)
(58) Field of Classification Search
 CPC .... H03F 19/00; H10N 60/0912; H10N 60/12; H10N 60/805; H10N 69/00
 USPC .............................. 330/4.5–4.6, 307
 See application file for complete search history.

(56) References Cited

U.S. PATENT DOCUMENTS

| | | | |
|---|---|---|---|
| 8,878,626 B2 | 11/2014 | Zmuidzinas et al. |
| 10,291,227 B2 | 5/2019 | Abdo |
| 10,740,688 B2 | 8/2020 | Selvanayagam et al. |
| 10,998,869 B2 | 5/2021 | Miano et al. |
| 2021/0226597 A1 | 7/2021 | Abdo et al. |
| 2021/0265963 A1 | 8/2021 | Kong |
| 2022/0021362 A1 | 1/2022 | Roch et al. |
| 2022/0094320 A1 | 3/2022 | Vesterinen et al. |

(Continued)

FOREIGN PATENT DOCUMENTS

| | | |
|---|---|---|
| CN | 113242027 A | 8/2021 |
| WO | 2021007153 A1 | 1/2021 |

(Continued)

OTHER PUBLICATIONS

Peng, K. et al., "Near-Ideal Quantum Efficiency with a Floquet Mode Traveling Wave Parametric Amplifier", arXiv:2104.08269v1 (2021), 16 pgs.

(Continued)

*Primary Examiner* — Hieu P Nguyen
(74) *Attorney, Agent, or Firm* — Intelletek Law Group, PLLC; Gabriel Daniel, Esq.

(57) ABSTRACT

A method of manufacturing a travelling wave parametric amplifier (TWPA) includes forming a superconducting junction on a substrate. Trenches are etched away through a metal surface and into a layer of dielectric material. The trenches define a plurality of fingers positioned in an interdigitated arrangement of capacitors defined by a metal and a dielectric material that remains from the etched away metal surface and the layer of dielectric material.

20 Claims, 7 Drawing Sheets

(56) References Cited

U.S. PATENT DOCUMENTS

2022/0311400 A1* 9/2022 White .................. H03F 7/00

FOREIGN PATENT DOCUMENTS

WO 2021026070 A1 2/2021
WO 2021/214383 A1 10/2021

OTHER PUBLICATIONS

Oh, S. et al., "Elimination of Two Level Fluctuators in Superconducting Quantum Bits by an Epitaxial Tunnel Barrier", Physical Review B (2006), vol. 74:100502(R), 4 pgs.

Qiu, J. et al., "Broadband Squeezed Microwaves and Amplification with a Josephson Traveling-Wave Parametric Amplifier", arXiv:2201.11261v2 (2022), 29 pgs.

Simbierowicz, S. et al., "A flux-driven Josephson Parametric Amplifier for sub-GHz Frequencies Fabricated with Side-Wall Passivated Spacer Junction Technology", Superconductor Science and Technology (2018), vol. 31:10, 7 pgs.

International Search Report and Written Opinion issued Feb. 13, 2024 in related international patent application No. PCT/IB2023/058757, 14 pgs.

Esposito, M. et al., "Perspective on Traveling Wave Microwave Parametric Amplifiers"; arXiv:2107.13033v5 [quant-ph] (2021); 8 pgs.

Eom, B. et al., "A Wideband, Low-Noise Superconducting Amplifier with High Dynamic Range"; arXiv:1201.2392v1 [cond-mat.supr-con] (2012); 23 pgs.

Macklin, C. et al., "A Near-Quantum-Limited Josephson Traveling-Wave Parametric Amplifier", Science (2015); vol. 350:6258, pp. 307-310.

Malnou, M. et al., "Three-Wave Mixing Kinetic Inductance Traveling-Wave Amplifier with Near-Quantum-Limited Noise Performance", PRX Quantum (2021); vol. 2, 010302-1-010302-17.

Chaudhuri, S. et al., "Broadband Parametric Amplifiers Based on Monlinear Kinetic Inductance Artificial Transmission Lines" Quant-ph (2017); 5 pgs.

Planat, L. et al., "Photonic-Crystal Josephson Traveling-Wave Parametric Amplifier", Phys. Rev. X (2020); vol. 10, 021021-1-021021-20.

Bultink, C. C. eta l., "General Method for Extracting the Quantum Efficiency of Dispersive Qubit Readout in Circuit" Quant-ph (2018); 10 pgs.

Naghiloo, M. et al., "Broadband Microwave Isolation with Adiabatic Mode Conversion in Coupled Superconducting Transmission Lines"; arXiv:2103.07793v1 [quant-ph] (2021); 13 pgs.

* cited by examiner

LOW LOSS TRAVELLING WAVE PARAMETRIC DEVICES USING PLANAR CAPACITORS

BACKGROUND

Technical Field

The present disclosure generally relates to electrical devices, and more particularly, to low loss travelling wave parametric devices using planar capacitors.

Description of the Related Art

In general, parametric devices use a time varying parameter to couple multiple modes. In a Josephson parametric device, the Josephson inductance acts as the time varying parameter. Josephson travelling wave parametric devices are typically amplifiers, isolators, or frequency converters, and are commonly used in the readout circuitry of superconducting quantum computing systems. More specifically Josephson traveling wave parametric devices rely on a non-resonant construction of series Josephson junctions with lumped-element capacitance to ground thereby creating an artificial transmission line. The non-resonant construction overcomes the bandwidth restrictions associated with resonant devices at the expense of requiring hundreds to thousands of series elements.

Some travelling wave parametric devices (TWPD) are designed in a fabrication process referred to as the tri-layer process. This superconducting thin-film process can exist in a variety of commercial and academic foundries, which allows for the fabrication of multi-layer superconducting circuits with thousands of Josephson Junctions in a single die. The process can also be compatible with passive radio frequency (RF) circuits (for example, transmission lines, inductors, etc.). In this process, a variety of circuits can be built, including amplifiers, logic circuits, such as single flux quantum (SFQ), detectors, etc. Unlike fabrication processes used to realize qubits, a tri-layer process relies on the use of dielectric materials with a comparatively high loss tangent, which is a noted tradeoff with junction yield. The tri-layer process is helpful to make a high-yielding TWPD which has thousands of junctions in series.

A generic tri-layer process can involve multiple thin-film superconductors on alternating dielectric layers. An example process to fabricate TWPD's can require just two metal layers. The dielectric materials between the two metal layers have a typical loss tangent on the order of 0.001. This results in a Josephson transmission-line that is inherently lossy. This loss can be captured in both simulation and measurement. For some current representative devices, the loss can be approximately 2-3 dB per device.

FIGS. 1 and 2 show an example of a conventional TWPD device unit cell. The cause of the loss in a conventional TWPD can be determined from a circuit model and the process used to fabricate the device. The majority of the series wiring is part of the superconducting stack, so the losses are minimal in that part of the circuit. However, as can be seen, the unit cell shown in FIGS. 1 and 2 uses a parallel plate capacitor 50 coupled to a junction 60. The parallel plate capacitor comprises a lossy $SiO_2$ dielectric that is deposited by way of a Plasma-enhanced chemical vapor deposition (PECVD) process.

The loss in current TWPD manufacturing processes affects the operation of a quantum computer. In one way, the loss is translated into the signal to noise ratio, and therefore fidelity, of the qubit state measurement in a quantum computing system. Extremely low powers, corresponding to single microwave photons populating a readout resonator, are used to interrogate the qubit to minimize unwanted perturbations of the qubit state. Given the desire to minimize the measurement power, it is important to maintain the signal to noise ratio of the qubit state measurement while the signal is transported from the quantum processor to the digitizing electronics at a higher temperature. This signal to noise ratio can be quantified as a quantum efficiency, which normalizes the signal to noise of the measurement to the limit set by noise associated with vacuum fluctuations of the electromagnetic field in the cryogenic environment. A TWPD can be used as an amplifier so that added noise from downstream components such as HEMT amplifiers negligibly impacts the overall quantum efficiency of the measurement. In contrast losses before amplification have an outsized effect, as they proportionally degrade the quantum efficiency of the qubit measurement. Thus, losses minimized in components, from the qubit chip up to and including the TWPD, may help preserve high quantum efficiency in the readout chain.

SUMMARY

According to an embodiment of the present disclosure, a travelling wave parametric device (TWPD), is provided. The TWPD includes a dielectric substrate and a periodic array of Josephson junctions situated in a tri-layer structure. The tri-layer structure includes a common electrode layer, a base electrode layer, and a layer of aluminum oxide positioned between the common electrode layer and the base electrode layer. The tri-layer structure is supported by the dielectric substrate. An interlevel dielectric layer is supported by the tri-layer structure. A metal layer is supported by the interlevel dielectric layer. The TWPD also includes a plurality of capacitors coupled to the Josephson junction that are arranged in an interdigitated arrangement in the tri-layer structure.

In one embodiment, which may be combined with the preceding embodiment, a first set of the plurality of capacitors is positioned on a first side of the Josephson junction and a second set of the plurality of capacitors is positioned on a second side of the Josephson junction. By positioning capacitors on both sides of the junction, the same period as a conventional TWPD can be retained while increasing the footprint available for capacitance overall. The overall capacitance for a TWPD can be retained while reducing the loss by using interdigitated capacitors.

In one embodiment, which may be combined with the preceding embodiments, a first set of the plurality of capacitors is positioned on a first side of the Josephson junction. A second set of the plurality of capacitors positioned on a second side of the Josephson junction.

In one embodiment, which may be combined with the preceding embodiments, the plurality of capacitors is positioned in any layer of the tri-layer structure.

In one embodiment, which may be combined with the preceding embodiments, the plurality of capacitors is positioned in the base electrode layer.

In one embodiment, which may be combined with the preceding embodiments, the plurality of capacitors is positioned on a same plane as a plane of the Josephson junction.

In one embodiment, which may be combined with the preceding embodiments, the plurality of capacitors is positioned on the common electrode layer.

In one embodiment, which may be combined with the preceding embodiments, the interlevel dielectric material is a thermal film.

In one embodiment, which may be combined with the preceding embodiments, the interlevel dielectric material is an epitaxial film.

In one embodiment, the TWPD is an amplifier.

In one embodiment, the TWPD is a frequency converter.

According to an embodiment of the present disclosure, a qubit system is provided. The qubit system includes a qubit, a resonator coupled to the qubit and a travelling wave parametric device (TWPD) coupled to the resonator. The TWPD includes a dielectric substrate and a periodic array of Josephson junctions situated in a tri-layer structure. The tri-layer structure includes a common electrode layer, a base electrode layer, and a layer of aluminum oxide positioned between the common electrode layer and the base electrode layer. The tri-layer structure is supported by the dielectric substrate. An interlevel dielectric layer is supported by the tri-layer structure. A metal layer is supported by the interlevel dielectric layer. The TWPD also includes a plurality of capacitors coupled to the Josephson junction that are arranged in an interdigitated arrangement in the tri-layer structure.

In one embodiment, which may be combined with the preceding embodiment, each capacitor of the plurality of capacitors is positioned on a same plane as each other capacitor in the plurality of capacitors. By using interdigitated capacitors on a same plane, the capacitance for a TWPD can be retained while reducing the loss at the dielectric level that can be seen when using parallel plate capacitors.

In one embodiment, the plurality of capacitors is positioned on a same plane as a plane of the Josephson junction.

In one embodiment, which may be combined with the preceding embodiments, the interlevel dielectric material is a thermal film.

In one embodiment, which may be combined with the preceding embodiment, the interlevel dielectric material is an epitaxial film.

In one embodiment, which may be combined with the preceding embodiment, a first set of the plurality of capacitors is positioned on a first side of the Josephson junction and a second set of the plurality of capacitors is positioned on a second side of the Josephson junction.

According to an embodiment of the present disclosure, a method of manufacturing a travelling wave parametric device (TWPD) is provided. The method includes forming a Josephson junction in a tri-layer structure, on a dielectric substrate. The method further includes patterning capacitors into an interdigitated arrangement on a metal surface of the tri-layer structure. Trenches in an interlevel dielectric material present between the capacitors are etched away.

In one embodiment, which may be combined with the preceding embodiment, the method includes using a thermal film or an epitaxial film as the interlevel dielectric material. The interlevel dielectric dominates the loss in a conventional TWPD with a tri-layer structure. By increasing the capacitor footprint and using a thermal film or epitaxial film for the interlevel dielectric material, the interlevel dielectric section of the device produces a lower loss tangent in the circuit.

In one embodiment, which may be combined with the preceding embodiment, the arrangement of interdigitated capacitors is formed on a single plane.

In one embodiment, which may be combined with the preceding embodiments, the arrangement of interdigitated capacitors is formed in sets positioned on opposite sides of the Josephson junction.

In one embodiment, which may be combined with the preceding embodiments, the arrangement of interdigitated capacitors is formed in any layer of the tri-layer structure.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1:
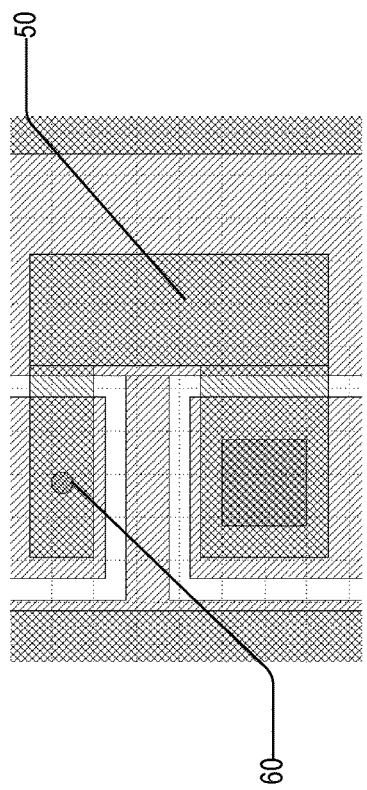
FIG. 1 is a diagrammatic top view of a travelling wave parametric device unit cell of the prior art.
Figure 2:
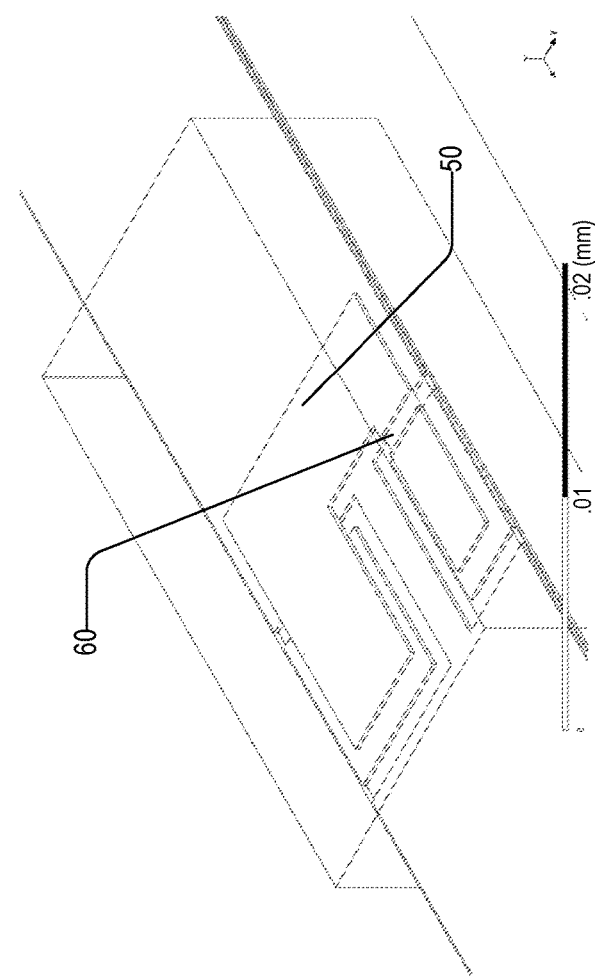
FIG. 2 is a diagrammatic top perspective view of the travelling wave parametric device of FIG. 1.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Referring to the Figures, embodiments of the subject device provide an unconventional structure for mitigating or reducing loss in a quantum computing system. In some applications, the TWPD is used as a Josephson travelling wave parametric amplifier (TWPA). Since loss happens before (or during) the first stage of amplification, the loss is roughly linearly proportional in its effect on the overall quantum efficiency on a system. Since the loss in the TWPA is mainly dominated by dielectric loss, the challenge becomes how this loss can be reduced to improve the efficiency. Embodiments of the subject technology generally provide a TWPD with reduced loss in the capacitor section of the device. In one aspect of the subject device, it will be appreciated that loss in a quantum computing device is reduced in a dielectric element and that reduction in loss translates into a substantially linearly proportional improvement on the quantum computing device's quantum efficiency. While the following is described mostly in terms of an amplifier as illustrative of one embodiment, the TWPD may be used in other applications and is configured accordingly so in a circuit including for example, as a frequency converter.

Figure 3:
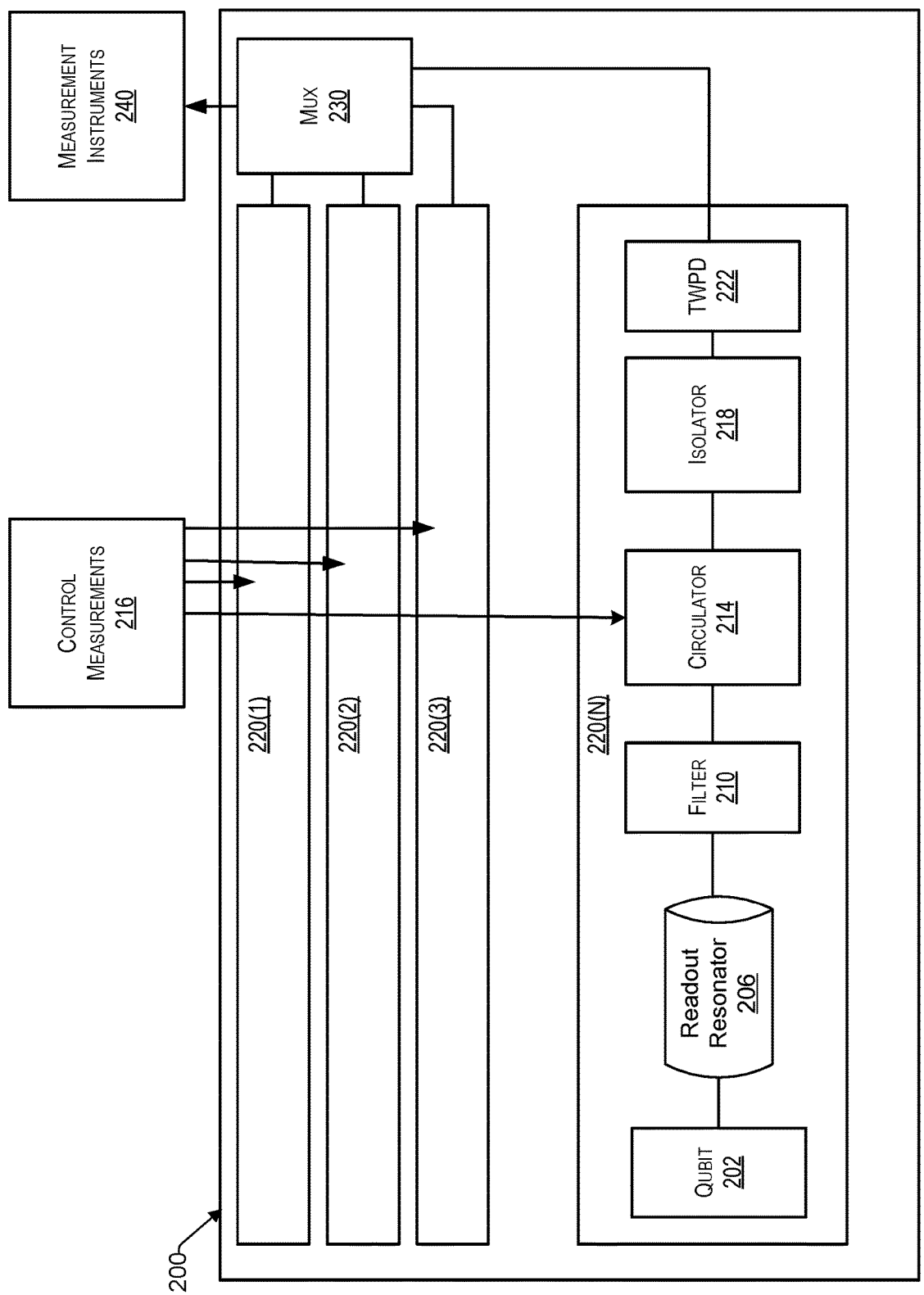
FIG. 3 is a block diagram of a quantum computing system according to an embodiment.

Reference now is made to FIG. 3, which is an example block diagram of a quantum computing system 200, consistent with an illustrative embodiment. Quantum computing system 200 includes a quantum processor comprising a plurality of qubits. As illustrated by way of example and not by way of limitation by block 220(N), each qubit system 220(1) to 220(N) may include a readout resonator 206 coupled to the qubit 202. For example, the readout resonator 206 affects a pulse coming from the control/measurement instruments 216 at the readout resonator frequency (e.g., 7 GHz). The pulse acts as a measurement that decoheres the qubit 202 and makes it collapse into a state of 1 or zero, thereby imparting a phase shift on that measurement pulse. The measurement of each readout resonator of each qubit system 220(1) to 220(N) may be spread out in frequency, as mentioned previously (e.g., 7.00 GHz, 7.05 GHz, 7.10 GHz, 7.15 GHz, etc.).

The readout resonator 206 may be coupled to a filter 210. The measurement fidelity is partially limited by the qubit 202 energy relaxation through the resonator 206 into a transmission line, which is also known as the Purcell effect. One way to suppress this energy relaxation is to use the filter 210, which impedes microwave propagation at the qubit frequency. The circulator 214 routes the input from the control/measurement instruments 216 to the filter 210 on to the qubit 202, at which the reflected measurement in which the state of the decohered qubit has been imparted, returns to the circulator 214 and is routed to the input of an isolator 218 and on to the measurement instruments 240 (for example, mixers, amplifiers, digitizers). This is an embodiment of a reflection measurement. Measurements may also be made in transmission, in which circulator 214 is not necessary.

In one embodiment, each qubit system 220(1) to 220(N) receives its corresponding control signal from the control/measurement instruments block 216. There is an isolator 218 coupled to the output of the circulator 214. The isolator 218 is a two-port device that has unidirectional transmission characteristics. Stated differently, the isolator 218 allows signals to propagate from the circulator 214 to a TWPD 222, but not from the TWPD 222 to the circulator 214. In some applications, the TWPD 222 may be an amplifier (such as a TWPA). Any power reflected from the load will be absorbed by the isolator 218, as opposed to being reflected back to the TWPD 222. For example, isolator 218 can have approximately 40 dB of suppression in the reverse direction. In various embodiments, different types of isolators that can be integrated can be used. It is noted that isolators may be built from circulators, and the examples within, by terminating one of the three ports with an appropriate resistor (e.g., a 50 Ohm resistor).

There qubit system 220(N) may include a frequency multiplexor (MUX) 230 that is operative to receive the output signal of a plurality (or all) of the qubit systems 220(1) to 220(N). The MUX 230 combines the signals and provides it to measurement instruments 240. The measurement instruments 240 provide an output representative of a state of each qubit from the corresponding qubit system 220(1) to 220(N).

Figure 4:
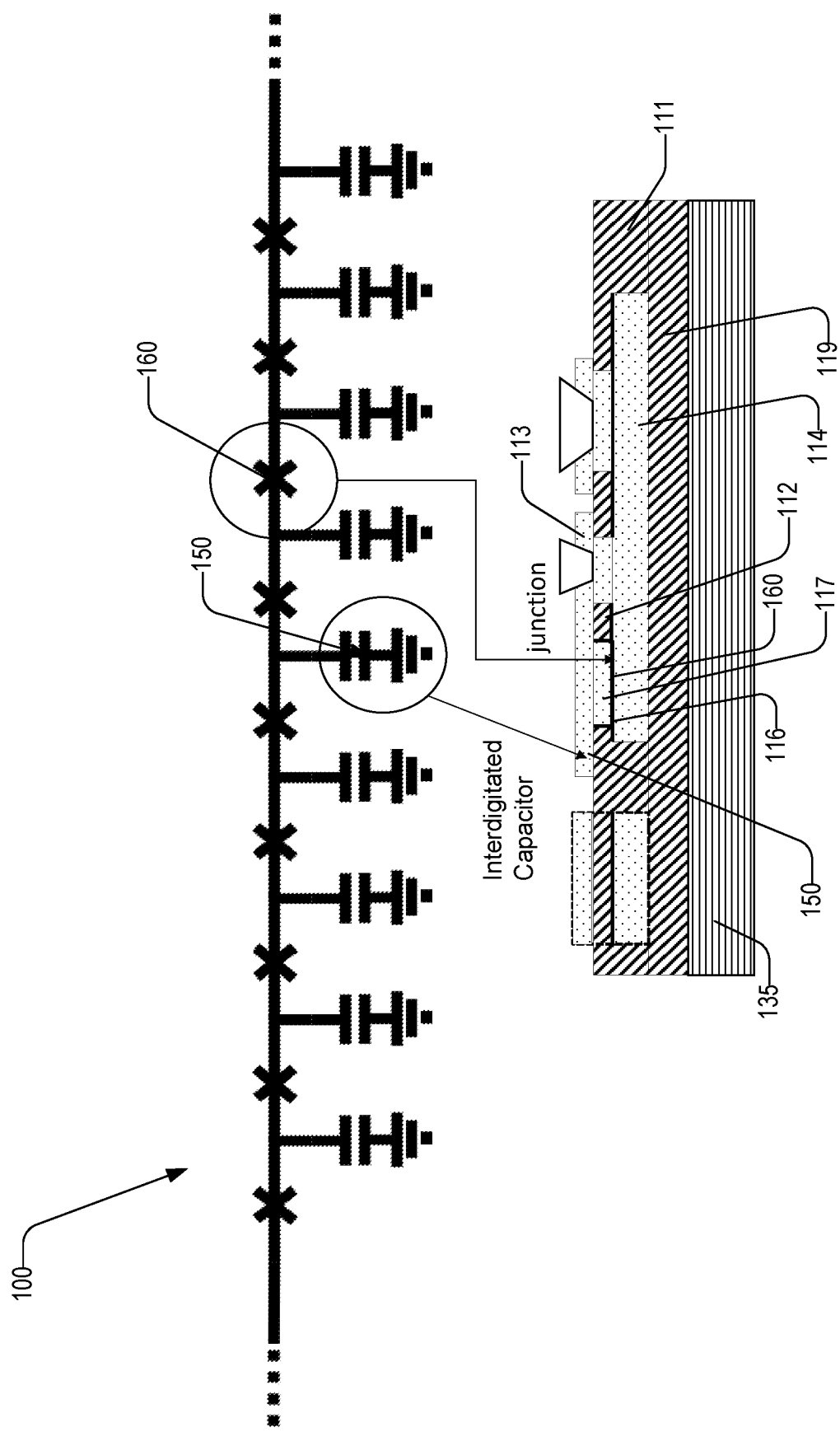
FIG. 4 is a diagrammatic view of a travelling wave parametric device according to an embodiment.

Referring now to FIGS. 4-8, a travelling wave parametric device (TWPD) 100 is shown. FIG. 4 shows an architecture of the TWPD 100 according to an embodiment. The TWPD 100 may include a dielectric substrate 135 supporting a layer of thermal oxide 119. The TWPD generally includes a periodic array of Josephson junctions 160 and a plurality of capacitors 150 coupled to at least one of the Josephson junctions 160. The capacitors 150 and the Josephson junctions 160 may be situated within a tri-layer structure. The tri-layer structure includes a base (or back) electrode layer 114, a common electrode layer 117, and a layer of aluminum oxide 116 positioned between the base electrode layer 114 and the common electrode layer 117. The tri-layer structure may be positioned in a layer of silicon dioxide 111. The tri-layer structure is supported by the dielectric substrate 135. In some embodiments, the TWPD 100 architecture includes an interlevel dielectric layer 112 supported by the tri-layer structure. Embodiments may include a metal layer 113 supported by the interlevel dielectric layer 112. In an exemplary embodiment, the plurality of capacitors 150 are arranged in an interdigitated arrangement in the tri-layer structure.

Figures 5, 5A:
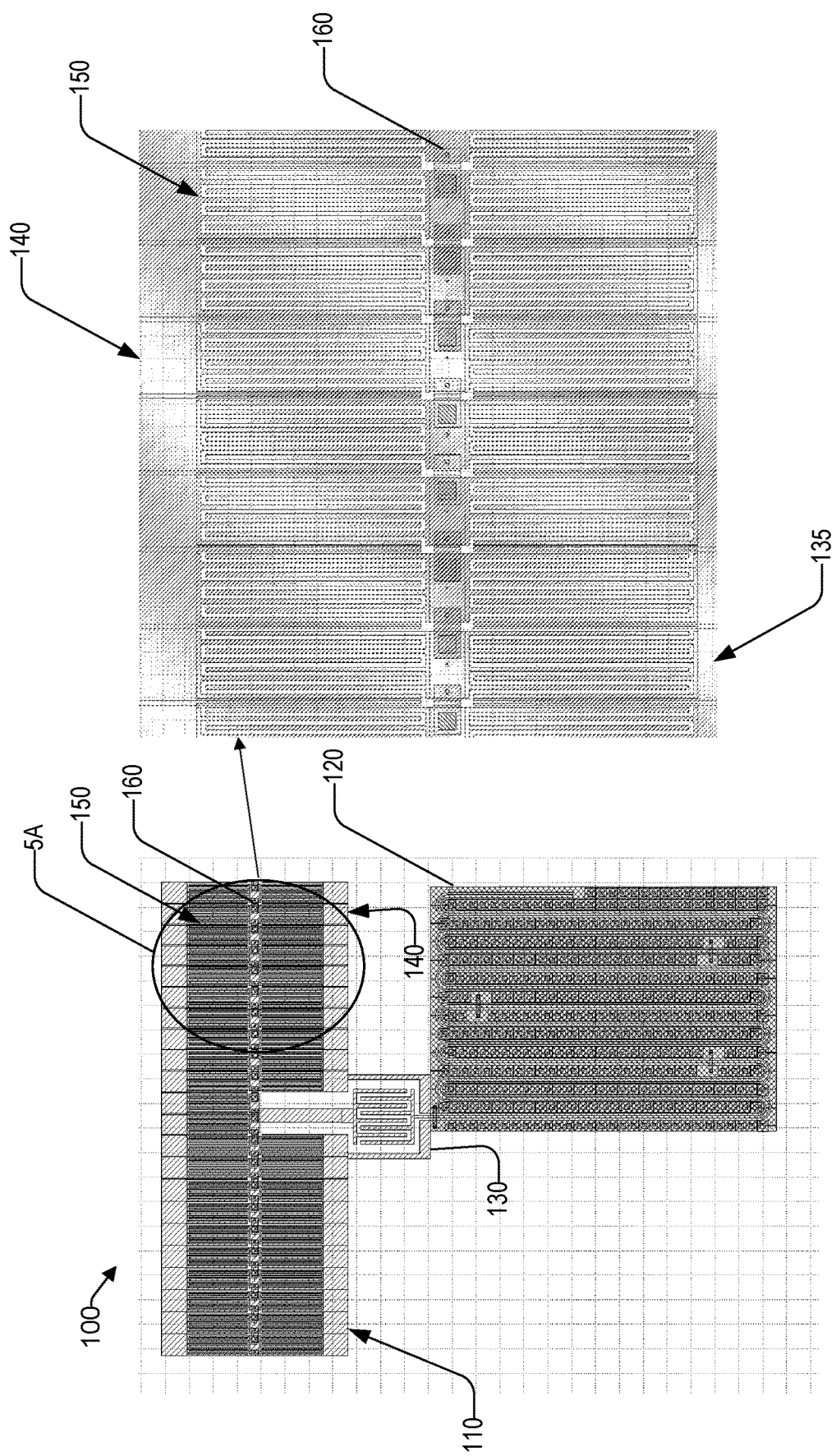
FIG. 5 is a diagrammatic top view of a section of a travelling wave parametric device according to an illustrative embodiment.
FIG. 5A is an enlarged view of the circle 5A of FIG. 5.

As shown now in FIGS. 5 and 5A, the TWPD 100 includes a unit cell 140 of junctions 160 and capacitors 150. For sake of illustration, only a section of the TWPD 100 is shown since in some embodiments, thousands of unit cells 140 may be connected in series and the depiction would exceed the available view on the page. The embodiment shown includes a dispersion resonator 120 (which may be analogous to the resonator 206 of FIG. 3) and a coupling capacitor 130 coupled to the rest of the circuit.

Figure 6:
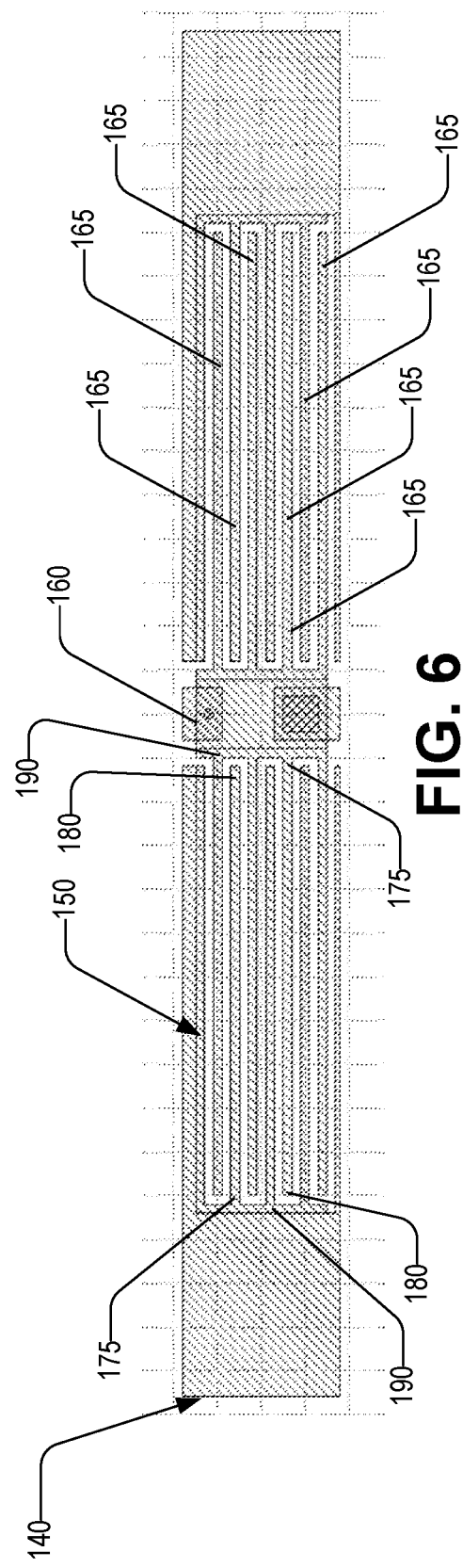
FIG. 6 is a diagrammatic, top view of a travelling wave parametric device unit cell according to an illustrative embodiment.
Figure 7:
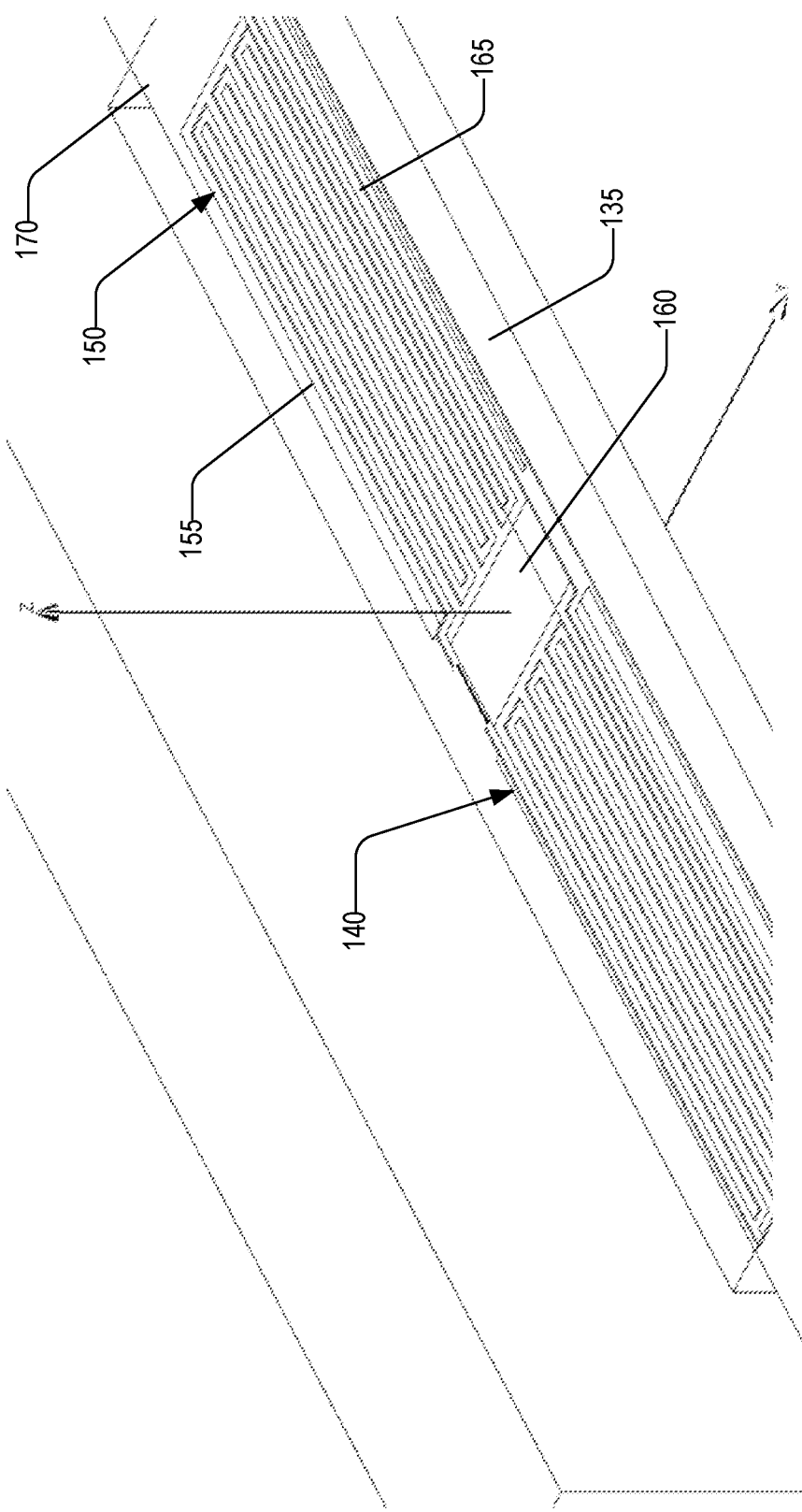
FIG. 7 is a top perspective view of a travelling wave parametric device according to an illustrative embodiment.
Figure 8:
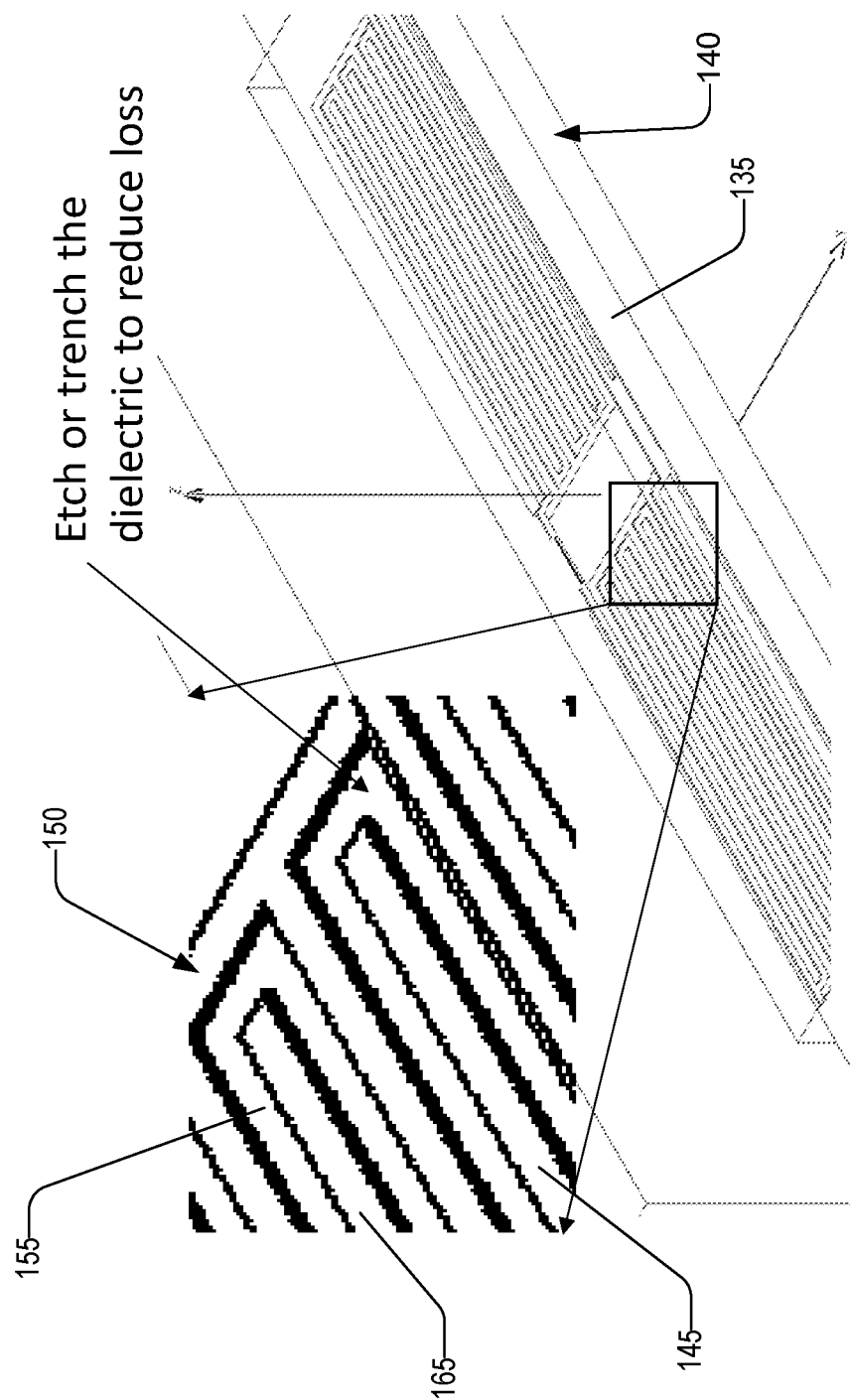
FIG. 8 is a top perspective view of the travelling wave parametric device of FIG. 7 with an enlarged inset view according to an illustrative embodiment.

As shown in FIGS. 6-8, each TWPD unit cell 140 includes a capacitor 150 coupled to a Josephson junction 160. The TWPD unit cells 140 may be formed on a top surface 170 (for example, the interlevel dielectric 113 shown in FIG. 4), of the dielectric substrate 135. The capacitor 150 may include a plurality of interdigitated fingers 165 providing an interdigitated capacitor. For example, a finger 165 may include a proximal, base end 175 that may be connected to a bus 190, and a free, distal end 180 that may not be connected to anything. See for example, FIG. 6. The fingers 165 may be arranged such that the free end 180 of one finger 165 may be positioned between or intermediate to base ends 175 of adjacent fingers 165 in alternating fashion. A gap or trench 155 may separate adjacent fingers 165 from each other. While the term "interdigitated" is used to describe the alternating arrangement of fingers 165, similar to fingers of opposing hands being clasped together, it will be understood that adjacent fingers 165 do not necessarily contact one another.

In an illustrative embodiment, the TWPD unit cell 140 may include a set of interdigitated fingers 165 on either or both sides of the junction 160. Positioning the fingers 165 on both sides of the junction 160 may provide a wider unit cell 140 with a period approximately the same as other TWPD cells, which maintains capacitance values similar to other TWPD cells but without the loss. The fingers 165 may be formed on the top surface 170 or co-planar with the top surface 170. The set of interdigitated fingers 165 on one side of the junction 160 may be positioned on a same plane as the set of interdigitated fingers 165 on the other side of the junction 160.

In one embodiment, the interdigitated fingers 165 may be formed in a process that etches away a dielectric material 145 that may be, for example, a thermal film or epitaxial film. The etching may form trenches 155 between metal fingers 165. The dielectric 145 between the fingers 165 may be etched away or trenched to reduce the fields that are present in the dielectric 145. The etching will also further reduce the participation ratio of the fields in the capacitor 150 which will reduce loss. In some embodiments, the etching may provide a constant width for respective fingers 165. The width of the new unit cell 140 is generally wider than conventional TWPA cells (for example, 20 um to ~120 um in the illustrative design shown) to accommodate the capacitor fingers 165 of the subject device.

CONCLUSION

It may be surprising that TWPD constructions with interdigitated capacitors in a tri-layer process provide a noticeable benefit. In such constructions, the lossy dielectric is still present to separate the two metal layers and many quantum devices, such as qubit processors, target effective loss tangents many orders of magnitude lower than can be achieved with such dielectrics present. However, in a TWPA, where the gain and loss are distributed throughout an extended array of lumped element components, a noticeable improvement to quantum efficiency can still be achieved with a factor of 2-3 reduction in the loss tangent.

The following results in Table 1 show that the disclosed structure using interdigitated capacitors does indeed reduce the loss by pulling the fields out of the lossy dielectric.

TABLE 1

| | Simulated Q | Extracted Loss(dB/m @) 7.5 GHz) | Total Loss for 2200 cell device (d = 15 um, f = 7.5 GHz) |
| --- | --- | --- | --- |
| Conventional Design | 368 | 67 | 2.2 dB |
| Disclosed Embodiment | 727 | 28 | 0.9 dB |

The quantum efficiency in a TWPD increases from 90.8% for a conventional design, to 95.5% for the disclosed TWPD structure. Reducing the loss in the TWPD can improve the quantum efficiency of the overall readout chain which is a measure of how much quantum information is acquired when the qubit state is readout.

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A travelling wave parametric device (TWPD), comprising:
   a dielectric substrate;
   a periodic array of Josephson junctions situated in a tri-layer structure, wherein:
   the tri-layer structure includes a common electrode layer, a base electrode layer, and a layer of aluminum oxide positioned between the common electrode layer and the base electrode layer, and
   the tri-layer structure is supported by the dielectric substrate;
   an interlevel dielectric layer supported by the tri-layer structure;
   a metal layer supported by the interlevel dielectric layer; and
   a plurality of capacitors coupled to the Josephson junction and arranged in an interdigitated arrangement in the tri-layer structure.

2. The TWPD of claim 1, further comprising:
   a first set of the plurality of capacitors positioned on a first side of the Josephson junction; and
   a second set of the plurality of capacitors positioned on a second side of the Josephson junction.

3. The TWPD of claim 1, wherein the plurality of capacitors is positioned in any layer of the tri-layer structure.

4. The TWPD of claim 1, wherein the plurality of capacitors is positioned in the base electrode layer.

5. The TWPD of claim 1, wherein the plurality of capacitors is positioned on a same plane as a plane of the Josephson junction.

6. The TWPD of claim 1, wherein the plurality of capacitors is positioned on the common electrode layer.

7. The TWPD of claim 1, wherein the interlevel dielectric material is a thermal film.

8. The TWPD of claim 1, wherein the interlevel dielectric material is an epitaxial film.

9. The TWPD of claim 1, wherein the TWPD is an amplifier.

10. The TWPD of claim 1, wherein the TWPD is a frequency converter.

11. A qubit system, comprising:
    a qubit;
    a resonator coupled to the qubit; and
    a travelling wave parametric device (TWPD) coupled to the resonator, the TWPD including,
    a dielectric substrate;
    a periodic array of Josephson junctions situated in a tri-layer structure, wherein:
    the tri-layer structure includes a common electrode layer, a base electrode layer, and a layer of aluminum oxide positioned between the common electrode layer and the base electrode layer, and
    the tri-layer structure is supported by the dielectric substrate;
    an interlevel dielectric layer supported by the tri-layer structure;
    a metal layer supported by the interlevel dielectric layer; and
    a plurality of capacitors coupled to the Josephson junction and arranged in an interdigitated arrangement in the tri-layer structure.

12. The qubit system of claim 11, wherein each capacitor of the plurality of capacitors is positioned on a same plane as each other capacitor in the plurality of capacitors.

13. The qubit system of claim 11, wherein the plurality of capacitors is positioned on a same plane as a plane of the Josephson junction.

14. The qubit system of claim 11, wherein the interlevel dielectric material is a thermal film.

15. The qubit system of claim 11, wherein the interlevel dielectric material is an epitaxial film.

16. The qubit system of claim 11, further comprising:
a first set of the plurality of capacitors is positioned on a first side of the Josephson junction; and
a second set of the plurality of capacitors is positioned on a second side of the Josephson junction.

17. A method of manufacturing a travelling wave parametric device (TWPD), comprising:
forming a Josephson junction in a tri-layer structure, on a dielectric substrate;
patterning capacitors into an interdigitated arrangement on a metal surface of the tri-layer structure; and
etching away trenches in an interlevel dielectric material present between the capacitors.

18. The method of claim 17, further comprising forming the arrangement of interdigitated capacitors on a single plane.

19. The method of claim 18, further comprising forming the arrangement of interdigitated capacitors in sets positioned on opposite sides of the Josephson junction.

20. The method of claim 17, further comprising forming the arrangement of interdigitated capacitors in any layer of the tri-layer structure.

\* \* \* \* \*